United States Patent
Musiol et al.

(10) Patent No.: US 10,419,057 B2
(45) Date of Patent: Sep. 17, 2019

(54) MODIFIED CURRENT MIRROR CIRCUIT FOR REDUCTION OF SWITCHING TIME

(71) Applicant: Skyworks Solutions, Inc., Woburn, MA (US)

(72) Inventors: Lothar Musiol, Irvine, CA (US); Yang Liu, Irvine, CA (US); Parham Hesamaddin, Irvine, CA (US); Lisette L. Zhang, Irvine, CA (US); Oleksandr Gorbachov, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/272,173

(22) Filed: Sep. 21, 2016

(65) Prior Publication Data

US 2017/0085223 A1    Mar. 23, 2017

Related U.S. Application Data

(60) Provisional application No. 62/222,112, filed on Sep. 22, 2015.

(51) Int. Cl.
| | |
|---|---|
| *H03F 1/02* | (2006.01) |
| *H03F 3/193* | (2006.01) |
| *H04B 1/40* | (2015.01) |
| *H03F 3/24* | (2006.01) |
| *H03F 1/30* | (2006.01) |

(Continued)

(52) U.S. Cl.
CPC ............. *H04B 1/40* (2013.01); *H03F 1/0261* (2013.01); *H03F 1/30* (2013.01); *H03F 1/301* (2013.01); *H03F 1/304* (2013.01); *H03F 3/193* (2013.01); *H03F 3/195* (2013.01); *H03F 3/245* (2013.01); *G05F 3/262* (2013.01); *H01L 2223/6644* (2013.01); *H03F 2200/18* (2013.01);

(Continued)

(58) Field of Classification Search
CPC ........... H03F 2200/294; H03F 2200/18; H03F 3/195; H03F 1/304; H03F 1/301; H03F 1/30; H03F 1/0261; H03F 2200/451; H03F 3/245; H03F 1/0205; H03F 2200/21; H03F 3/193; H04B 1/40
See application file for complete search history.

(56) References Cited

U.S. PATENT DOCUMENTS

| | | |
|---|---|---|
| 3,763,438 A | 10/1973 | Towne |
| 2003/0232609 A1 | 12/2003 | Yates |

(Continued)

OTHER PUBLICATIONS

International Search Report and Written Opinion for PCT/US16/53135 (dated Dec. 15, 2016).

(Continued)

*Primary Examiner* — Aristocratis Fotakis
(74) *Attorney, Agent, or Firm* — Stetina Brunda Garred & Brucker

(57) ABSTRACT

A current mirror circuit connectible to an amplifier circuit to set a bias point thereof includes a current mirror circuit, and a bias resistor connected thereto. The bias resistor is connectible to the amplifier circuit. A first helper circuit is connected in parallel with the bias resistor, and is selectively activated for a first predetermined duration by a first control signal. The activated first helper circuit defines a lower resistance path relative to the bias resistor to shorten a rising transient response of the amplifier circuit as the current mirror circuit is activated.

30 Claims, 8 Drawing Sheets

(51) Int. Cl.
*H03F 3/195* (2006.01)
*G05F 3/26* (2006.01)

(52) U.S. Cl.
CPC .... *H03F 2200/21* (2013.01); *H03F 2200/294* (2013.01); *H03F 2200/451* (2013.01)

(56) References Cited

U.S. PATENT DOCUMENTS

| | | | | |
|---|---|---|---|---|
| 2005/0059362 A1* | 3/2005 | Kalajo | .................. | H03F 1/0261 455/127.1 |
| 2005/0083129 A1* | 4/2005 | Tsurumaki | .............. | H03F 1/301 330/285 |
| 2005/0184786 A1* | 8/2005 | Nishikawa | ............... | H03K 5/13 327/276 |
| 2005/0264363 A1 | 12/2005 | Kang et al. | | |
| 2005/0266820 A1* | 12/2005 | Behzad | .................... | H04B 1/30 455/306 |
| 2006/0256486 A1* | 11/2006 | Kim | .................. | H03H 11/1291 361/18 |
| 2007/0279032 A1* | 12/2007 | Chang | .................. | H03H 7/0153 323/315 |
| 2011/0032022 A1* | 2/2011 | Flewelling | ............ | H03K 19/001 327/478 |
| 2013/0187629 A1* | 7/2013 | Figueiredo | ............ | H03M 1/002 323/315 |
| 2013/0207711 A1* | 8/2013 | Ikeda | .................. | H03K 17/145 327/378 |
| 2013/0260704 A1* | 10/2013 | Yu | ......................... | H03F 1/0261 455/127.3 |
| 2016/0173098 A1* | 6/2016 | Jaffari | ............ | H03K 19/018528 326/83 |

OTHER PUBLICATIONS

Paul R. Gray Paul J. Hurst Stephen H. Lewis Robert G. Meyer; Analysis and Design of Analog Integrated Circuits (Fifth Edition Ed.) New York: Wiley; p. 255. ISBN-13: 978-0470245996 ISBN-10: 0470245999; (2009).

* cited by examiner

MODIFIED CURRENT MIRROR CIRCUIT FOR REDUCTION OF SWITCHING TIME

CROSS-REFERENCE TO RELATED APPLICATIONS

The application relates to and claims the benefit under 35 U.S.C. § 119(e) to U.S. Provisional Patent Application No. 62/222,112 filed Sep. 22, 2015 and entitled "MODIFIED CURRENT MIRROR CIRCUIT FOR REDUCTION OF SWITCHING TIME," the entire contents of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) circuitry, and more particularly, to modified current mirror circuits for reduction of switch time.

2. Related Art

Wireless communications systems are utilized in a variety contexts involving information transfer over long and short distances alike, and a wide range of modalities for addressing the particular needs of each being known in the art. As a general matter, wireless communications involve an RF carrier signal that is variously modulated to represent information/data, and the encoding, modulation, transmission, reception, de-modulation, and decoding of the signal conform to a set of standards for coordination of the same.

Fundamental to any wireless communications systems is a transceiver, that is, a combined transmitter and receiver circuitry. More particularly, in a digital data communications system, the digital baseband system of the transceiver encodes the digital data to an analog baseband signal, and modulates the baseband signal with an RF carrier signal. Upon receipt, the transceiver down-converts the RF signal, demodulates the baseband signal, and decodes the digital data represented by the baseband signal. A transmitting antenna connected to the transmitting transceiver converts the electrical signal to electromagnetic waves, while a receiving antenna connected to the receiving transceiver converts the electromagnetic waves to an electrical signal. In most cases, the transceiver circuitry itself does not generate sufficient power or have sufficient sensitivity necessary for communications. Thus, additional circuits are referred to as a front end is utilized between the transceiver and the antenna. The front end includes a power amplifier for boosting transmission power, and/or a low noise amplifier to increase reception sensitivity.

The RF amplifier, particularly those utilizing metal oxide semiconductors (MOS), may incorporate a current mirror circuit to set the bias point of the RF amplifier transistor. The current mirror circuit typically includes a pair of transistors coupled together such that the current through one of the devices matches, or mirrors the current in the other device. The mirror transistor is connected to the gate of the RF amplifier transistor over a mirror resistor, while the mirror transistor is connected to a control circuit that turns on and turns off the mirror transistor within a specific timeframe.

There is understood to be a residual capacitance comprised of a combination of the mirror transistor gate capacitance and the coupling capacitor that carries the RF signal to the RF amplifier transistor gate. Such residual capacitance, together with the aforementioned mirror resistor, defines an RC time constant, which significantly slows the transient response of the current mirror/biasing circuit. Although a reduction of the mirror resistor may reduce the RC time constant and hence the delay in the transient response, the mirror resistor must also be sufficiently high to avoid degradation in signal quality at the gate of the RF amplifier transistor.

More particularly, a low resistance value for the mirror resistor negatively affects performance parameters such as noise figure, while a high resistance value for the mirror resistor results in an extended transition period between the on and off states in the RF amplifier transistor. In some prior implementations, a switch may short the RF amplifier transistor gate voltage to ground when turning off the transistor, but the transient response when turning on the transistor would not be improved.

Thus, as a general matter, optimizing for a short transient response and improving the noise figure, particularly with respect to the mirror transistor, are mutually exclusive. Accordingly, there is a need in the art for independent optimization of the transient response and the noise figure of the RF amplifier circuit with the bias point set by the current mirror circuit.

BRIEF SUMMARY

The present disclosure contemplates various embodiments of a current mirror circuit used to set the bias point of a radio frequency amplifier transistor. Signal quality performance parameters of the radio frequency amplifier may be optimized independently of switching time, without reliance on complex digital control circuits.

In accordance with one embodiment, there is a radio frequency amplifier circuit. There may be a primary amplifier circuit that is connected to an input signal source. Furthermore, there may be a current mirror circuit that is connected to the primary amplifier circuit to set a bias point thereof. The radio frequency amplifier circuit may also include a bias resistor that is connected to the primary amplifier circuit and the current mirror circuit. A first helper circuit may be connected in parallel across the bias resistor, and may be selectively activated for a first predetermined duration by a first control signal that is based upon a transient component of an enable logic signal transitioning from an off state to an on state. The activated first helper circuit may define a lower resistance path relative to the bias resistor. The circuit may also include a first helper control circuit that is connected to the first helper circuit. The first control signal may be output by the first helper control circuit in response to the enable logic signal.

Another embodiment contemplates a current mirror circuit connectible to an amplifier circuit to set a bias point thereof. The current mirror circuit may include a current mirror transistor, and a bias resistor connected thereto. The bias resistor may also be connectible to the amplifier circuit. The current mirror circuit may further include a first helper circuit that is connected in parallel with the bias resistor. The first helper circuit may be selectively activated for a first predetermined duration by a first control signal. The activated first helper circuit may define a lower resistance path relative to the bias resistor to shorten a rising transient response of the amplifier circuit as the current mirror transistor is activated. The current mirror circuit may include a second helper circuit connected in parallel with the bias resistor. The second helper circuit may be selectively activated for a second predetermined duration by a second control signal that is inverse of the first control signal. The activated second helper circuit may define a lower resistance path relative to the bias resistor to shorten a falling transient response of the amplifier circuit as the current mirror transistor is deactivated.

According to another embodiment of the present disclosure, a method for reducing a response time of an amplifier circuit being transitioned from a deactivated state to an activated state with a current mirror circuit is contemplated. The method may include activating a current mirror circuit. There may also be a step of receiving an enable signal on a first helper control circuit. The method may continue with generating a first control signal of a first predetermined duration with the first helper control circuit in response to the received enable signal. There may additionally be a step of activating, for the first predetermined duration, a first helper circuit in response to the first control signal from the first helper control circuit. The first helper circuit may define a lower resistance path relative to a bias resistor in an activated state, and together with a residual capacitance associated with the amplifier circuit and coupling thereto, may define a lower resistor-capacitor time constant relative to a resistor-capacitor time constant corresponding to the bias resistor and the residual capacitance.

The present invention will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The detailed description set forth below in connection with the appended drawings is intended as a description of the several presently contemplated embodiments of radio frequency amplifier circuits and current mirror circuits and are not intended to represent the only form in which the disclosed circuits may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
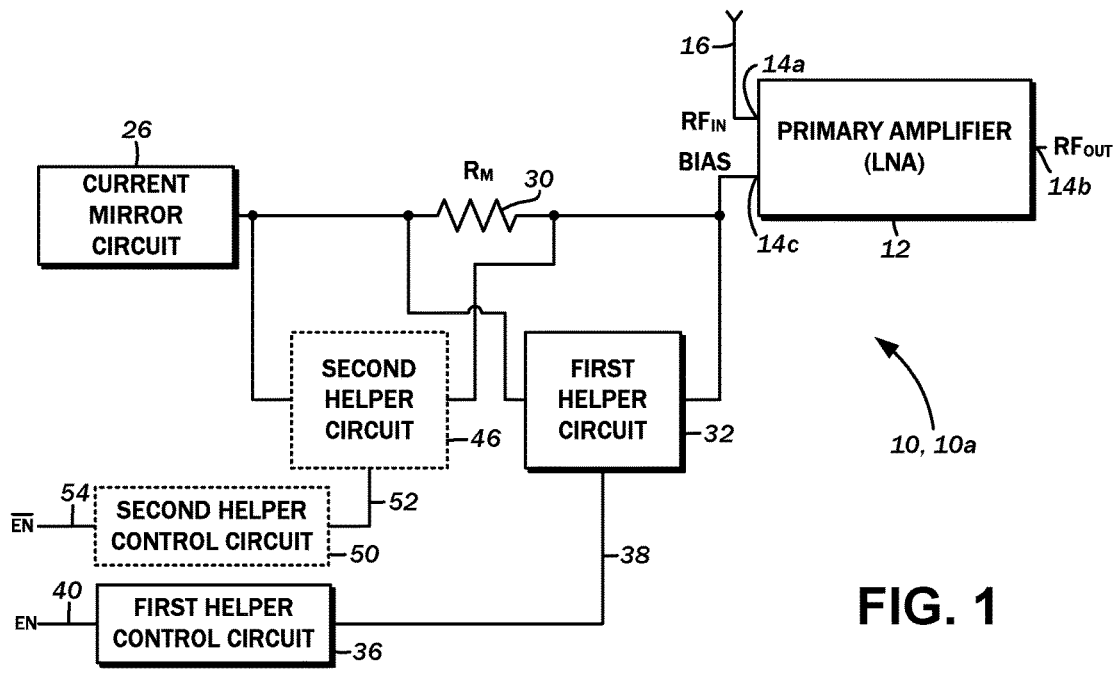
FIG. 1 is a block diagram of an amplifier circuit according to a first embodiment of the present disclosure.

The block diagram of FIG. 1 shows one embodiment of an amplifier circuit 10 with a modified current mirror in accordance with the present disclosure. In various implementations, the amplifier circuit 10 includes a primary amplifier 12, which may be for a radio frequency front end circuit, and specifically a low noise amplifier that amplifies received radio frequency signals for further processing by a transceiver. The primary amplifier 12 is generally defined by an input port 14a, an output port 14b, and a bias port 14c. In embodiments where the primary amplifier 12 is a low noise amplifier, the input port 14a may be connected to an antenna 16, and the output port 14b may be connected to the transceiver. However, this would be the opposite if the primary amplifier 12 is a power amplifier configured to boost radio frequency transmit signals. It will be appreciated by those having ordinary skill in the art, however, that any other signal source may be connected to the input port 14a of the primary amplifier 12 without departing from the scope of the present disclosure.

Figure 2:
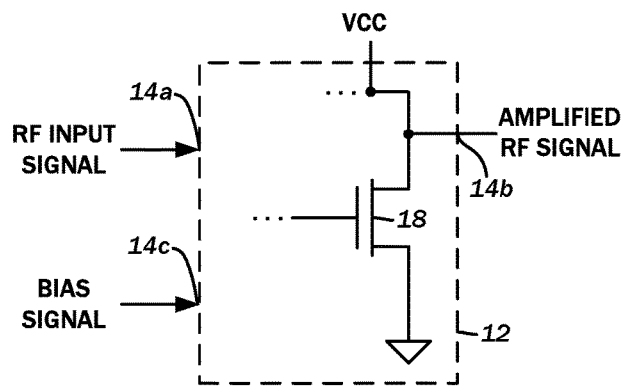
FIG. 2 is a diagram of a primary amplifier that may be utilized in the amplifier circuit as depicted in the block diagram of FIG. 1.

FIG. 2 illustrates additional details of the primary amplifier 12 that may be utilized in the amplifier circuit 10 such as that shown in FIG. 1. Again, the primary amplifier 12 includes an input port 14a that receives a radio frequency input signal and provide the same to one or more transistors 18 (e.g., one or more transistor stages). In certain embodiments, the primary amplifier 12 includes one or more amplifying transistors 18, which may be, for example, metal oxide semiconductor field effect transistor(s) (MOSFET(s)), in which the gate of the transistor(s) receives the radio frequency signal to be amplified. Each of the one or more transistors 18 may be grounded at its drain and the voltage level provided at the gate of the transistor 18 may control current passing between a source portion and the drain portion. The source may provide an output signal which corresponds to an amplified version of the radio frequency input signal provided to the primary amplifier 12. Various other configurations of amplifiers may be used in accordance with the embodiments disclosed herein and may include amplifies comprising any suitable type of configuration of transistor or transistors. The amplifying transistor 18 may be one amplifier of a multi-state amplifier.

The transistor 18 may be a n-channel field effect transistor or a p-channel field effect transistor. While the present disclosure makes specific reference to connections to either the source or the drain of the transistor, it will be appreciated that these are presented by way of example only and not of limitation. Furthermore, any of the embodiments disclosed herein may comprise collector regions, wells, and/or bulk substrates having any suitable or desirable type or level of doping.

Figure 3:
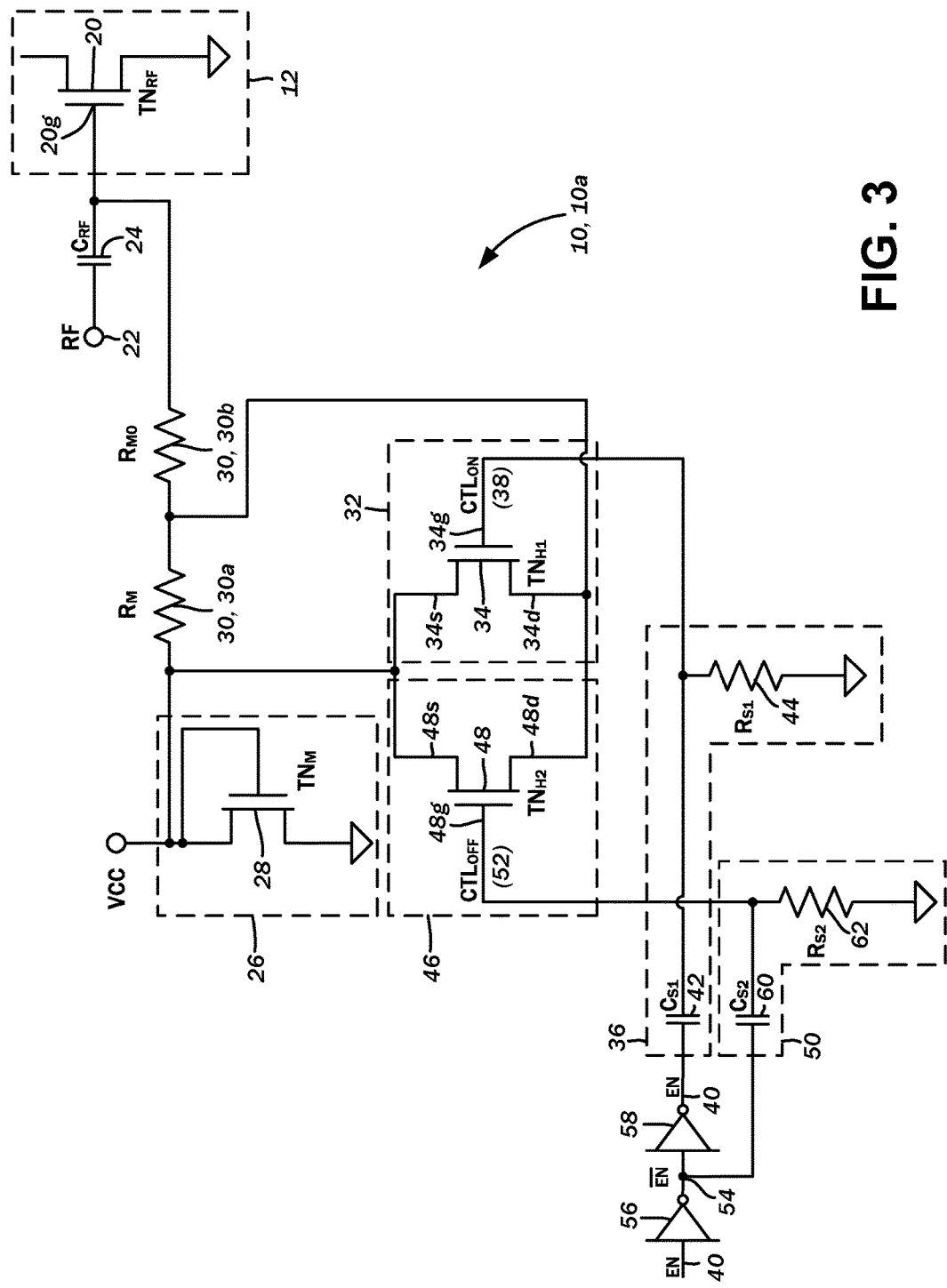
FIG. 3 is a detailed schematic diagram of the first embodiment of an amplifier circuit in accordance with the present disclosure and corresponding to the circuit shown in FIG. 1.

The schematic diagram of FIG. 3 illustrates additional details of the first embodiment of the amplifier circuit 10a. The primary amplifier 12 includes a primary amplifier transistor ($TN_{RF}$) 20. A gate 20g of the primary amplifier transistor 20 is connected to a radio frequency signal input 22, a radio frequency signal therefrom being amplified by the primary amplifier transistor 20 in accordance with conventional principles known in the art. The radio frequency signal input 22 is connected to the gate 20g with a coupling capacitor ($C_{RF}$) 24. The gate 20g is also understood to define a capacitance that is cumulative with the coupling capacitor 24.

Referring again to the block diagram of FIG. 1, the amplifier circuit 10 further includes a current mirror circuit 26 that sets the bias point of the primary amplifier 12. That is, the bias signal provided by the current mirror circuit 26 facilitates a quiescent state of the primary amplifier 12. As shown in FIG. 3, the current mirror circuit 26 includes a current mirror transistor ($TN_M$) 28 connected to the primary amplifier 12, and specifically the gate 20g of the primary amplifier transistor 20, over a bias resistor ($R_M$) 30. By selectively activating and deactivating the current mirror transistor 28, the primary amplifier transistor 20 can likewise be correspondingly activated and deactivated. In order to maintain signal quality at the gate 20g of the primary amplifier transistor 20, the bias resistor 30 is set a relatively high level. It will be appreciated that the bias resistor 30 together with the coupling capacitor 24 and the gate capacitance of the primary amplifier transistor 20 defines a resistor-capacitor (RC) time constant that slows the transient response to the biasing voltage activation from the current mirror transistor 28.

Various embodiments of the present disclosure contemplate minimizing the impact of the bias resistor 30 on the transient response of the primary amplifier 12. As shown in FIG. 1, there is a first helper circuit 32 that is connected in parallel across the bias resistor 30. FIG. 3 more particularly depicts a first helper transistor ($TN_{H1}$) 34 that is connected in parallel across the bias resistor 30. In some embodiments as illustrated, the bias resistor 30 may be split, with a main component ($R_M$) 30a and a secondary component ($R_{M0}$) 30b. The secondary component 30b is understood to have a lower resistance value than the main component 30a, and the first helper circuit 32, and specifically the first helper transistor 34 is connected across the main component 30a only. The first helper transistor may have a gate 34g, a source 34s, and a drain 34d. The parallel connection of the first helper transistor 34 relative to the bias resistor 30 refers to either the source 34s or the drain 34d being connected to a first terminal of the bias resistor 30, with the other one of the source 34s or drain 34d being connected to a second terminal of the bias resistor 30.

When the first helper circuit 32 is activated, that is, when the first helper transistor 34 is turned on, the effective combined resistance between the current mirror circuit 26 and the primary amplifier 12 is reduced, as the lower resistance of the activated first helper circuit 32, and specifically the first helper transistor 34, defines a low resistance path in parallel to the bias resistor 30. The RC time constant of such resistance and the aforementioned coupling capacitor 24 and the gate capacitance of the primary amplifier transistor 20 is thereby reduced, shortening the transient response time of the primary amplifier transistor 20 to the current mirror transistor 28 being turned on.

As shown in FIG. 1, the first helper circuit 32 is connected to a first helper control circuit 36, and is understood to be turned on or off thereby. More particularly, the first helper control circuit 36 is connected to the gate 34g and generates a first control signal ($CTL_{ON}$) 38, which activates the first helper circuit 32 and specifically the first helper transistor 34 thereof. The first control signal 38 is generated by the first helper control circuit 36 in response to an enable logic signal 40.

The first control signal 38 is understood to have a first predetermined duration, and is operative to turn on the first helper transistor 34 only while the bias voltage from the current mirror transistor 28 transitions from the off state to the on state, that is, from when the primary amplifier transistor 20 is initially deactivated to when it is activated and amplifying the input signal in its steady state. In this regard, the generation of the first control signal 38 may be based upon a transient component of the enable logic signal 40 transitioning from the off state to the on state.

Upon the first helper circuit 32 being deactivated, e.g., when the first helper transistor 34 is turned off, the resistance between the current mirror circuit 26 and the primary amplifier 12 returns to the value of the bias resistor 30 by itself, thereby reducing the noise figure and improving signal quality.

The first helper control circuit 36 thus includes a first series capacitor ($C_{S1}$) 42 that is connected to a first shunt resistor ($R_{S1}$) 44, both components being tuned to momentarily pass the voltage of the enable logic signal 40 to the gate 34g of the first helper transistor 34 as the first control signal 38 for a selected or predetermined time period. At other times, the voltage of the enable logic signal 40 may be shunted to ground.

The first helper transistor 34 and the first helper control circuit 36 thus momentarily reduces the effective resistance of the bias resistor 30 when the current mirror transistor 28 activates the primary amplifier transistor 20, that is, when transitioning from the off or deactivated state to the on or activated state. The embodiment of the amplifier circuit 10 shown in FIG. 3 also contemplates the momentary reduction in the effective resistance of the bias resistor 30 when the current mirror transistor 28 deactivates the primary amplifier transistor 20, that is, when transition from the on or activated state to the off or deactivated state.

As shown in the block diagram of FIG. 1, this embodiment includes a second helper circuit 46. The schematic diagram of FIG. 3 further illustrates that the second helper circuit 46 includes a second helper transistor ($TN_{H2}$) 48 that is likewise connected in parallel across the bias resistor 30. Like the first helper transistor 34 of the first helper circuit 32, the second helper transistor 48 may have a gate 48g, a source 48s, and a drain 48d. The parallel connection of the second helper transistor 48 relative to the bias resistor 30 refers to either the source 48s or the drain 48d being connected to a first terminal of the bias resistor 30, with the other one of the source 48s or drain 48d being connected to a second terminal of the bias resistor 30. In embodiments where the bias resistor is split, the second helper transistor 48 is understood to be connected across the main component 30a only.

When the second helper circuit 46 is activated, that is, when the second helper transistor 48 is turned on, the effective combined resistance between the current mirror circuit 26 and the primary amplifier 12 is also reduced, as the lower resistance of the activated second helper circuit 46, and specifically the second helper transistor 48, defines a low resistance path in parallel to the bias resistor 30. The RC time constant of such resistance and the aforementioned coupling capacitor 24 and the gate capacitance of the primary amplifier transistor 20 is thereby reduced, shortening the transient response time of the primary amplifier transistor 20 to the current mirror transistor 28 being turned off.

As shown in FIG. 1, the second helper circuit 46 is connected to a second helper control circuit 50, and is understood to be turned on or off thereby. More particularly, the second helper control circuit 50 is connected to the gate 48g and generates a second control signal ($CTL_{OFF}$) 52, which activates the second helper circuit 46 and specifically the second helper transistor 48 thereof. The second control signal 52 is generated by the second helper control circuit 50 in response to an inverse enable logic signal 54.

Where the first helper circuit 32 is activated to shorten the rising transient response and the second helper circuit 46 is activated to shorten the falling transient response, the enable logic signal 40 and an inverse enable logic signal 54 may be necessary. In the exemplary embodiment of FIG. 3, a single enable line may be used, with either a logic "high" or "on," or a logic "low" or "off" being provided from an external source such as the transceiver. The enable line may thus be "high" or "on" when the current mirror circuit 26 and the primary amplifier 12 are activated, and "low" or "off" when the current mirror circuit 26 and the primary amplifier 12 are deactivated. The gate 34g, 48g are understood to require a voltage to turn on the respective helper transistors 34, 48, so a first inverter 56 is utilized to generate such voltage while the single enable line is otherwise at a logic "low" or "off." When transitioning the current mirror circuit 26 and the primary amplifier 12 from an activated state to a deactivated state, the enable line may transition from "high"/"on" to "low"/"off." Upon this signal being passed to the first inverter 56, the inverse is true, and it thus transitions from "low"/"off" to "high"/"on", thereby activating the second helper circuit 46.

The amplifier circuit 10 shown in FIG. 3 utilizes a second inverter 58 that inverts the inverse enable logic signal 54 again, prior to it being passed to the first helper control circuit 36. This is presented by way of example only and not of limitation, and the enable logic signal 40 may be directly passed to the first helper control circuit 36 without being passing through the first inverter 56 and the second inverter 58.

This activation of the second helper circuit 46, that is, the second control signal 52, is likewise understood to be momentary and for a second predetermined duration. The second control signal 52 is operative to turn on the second helper transistor 48 only while the bias current from the current mirror circuit 26 transitions from the off state to the on state, that is, from when the primary amplifier 12 is activated and amplifying the input signal to when it is deactivated. The generating of the second control signal 52 may be based upon a transient component of the inverse enable logic signal 54 transitioning from the off state to the on state. Upon the second helper circuit 46 being deactivated, the resistance between the current mirror circuit 26 and the primary amplifier 12, and in particular the current mirror transistor 28 and the primary amplifier transistor 20, returns to the value of the bias resistor 30 by itself, thereby reducing the noise figure and improving signal quality.

The second helper control circuit 50 thus includes a second series capacitor ($C_{S2}$) 46 that is connected to a second shunt resistor ($R_{S2}$) 48, both components being tuned to momentarily pass the voltage of the inverse enable logic signal 54 to the gate 48g of the second helper transistor 48 as the second control signal 52 for a selected or predetermined time period. At other times, the voltage of the inverse enable logic signal 54 may be shunted to ground. The first helper control circuit 36 may be tuned independently of the second helper control circuit 50, that is, the first series capacitor 42 may have a different value than the second series capacitor 60 and the first shunt resistor 44 may have a different value than the second shunt resistor 62, depending on the rising transient and falling transient timing requirements.

With reference again to the block diagram of FIG. 1, an embodiment of the amplifier circuit 10a thus contemplates a current mirror circuit 26 that is connected to and biases the primary amplifier 12. Again, the current mirror circuit 26 is so connected to the primary amplifier 12 over the bias resistor 30. Connected in parallel to the bias resistor 30 is the first helper circuit 32 that is activated and deactivated by the first helper control circuit 36, which generates the first control signal 38 in response to the enable logic signal 40 that may originate from a transceiver or other external control circuitry. Optionally, the second helper circuit 46 may likewise be connected in parallel to the bias resistor 30. The second helper circuit 46 may be activated and deactivated by the second helper control circuit 50 that generates the second control signal 52 in response to the inverse enable logic signal 54.

Figure 4:
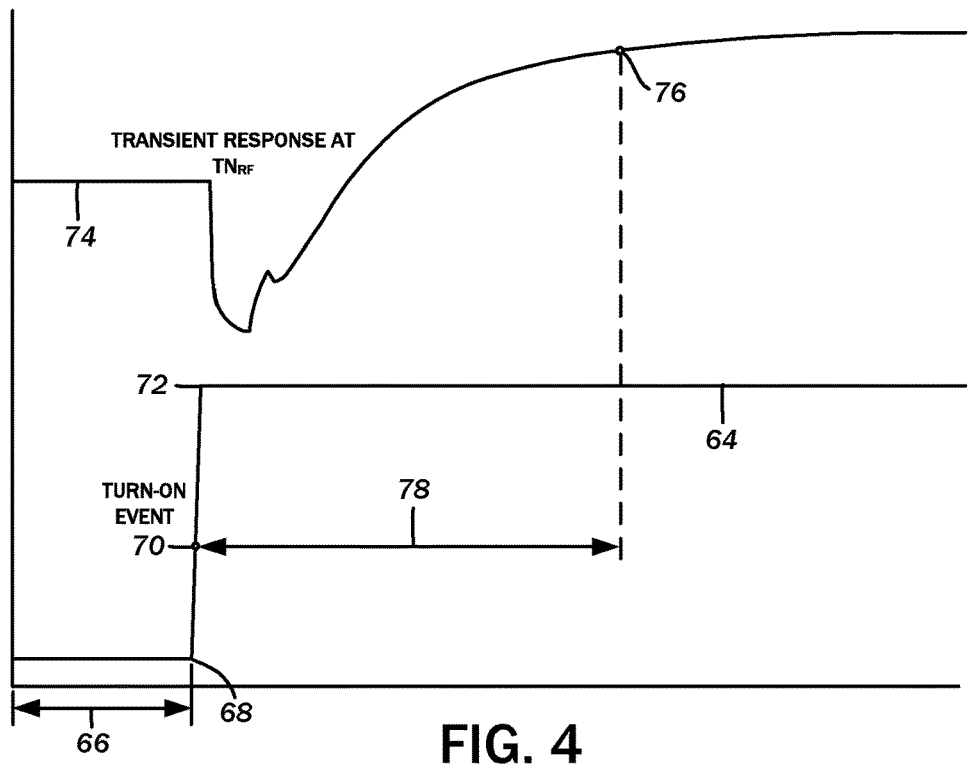
FIG. 4 is graph showing the transient response of a conventional current mirror circuit with long turn-on duration.
Figure 5:
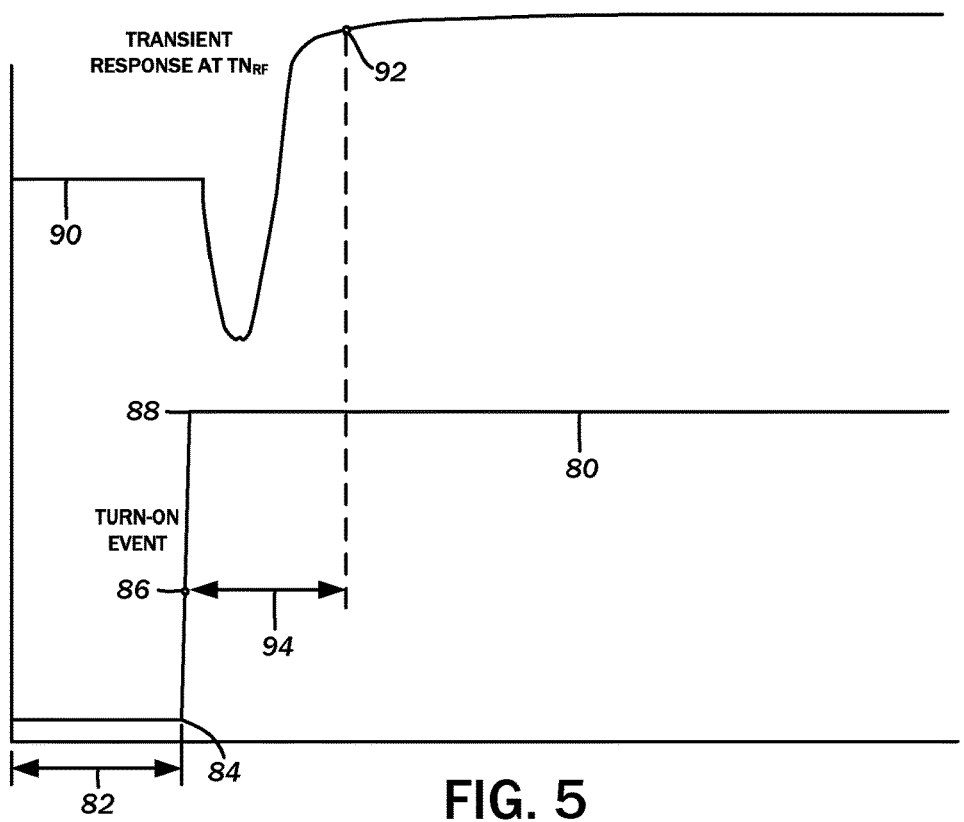
FIG. 5 is a graph showing the transient response of the amplifier circuit in accordance with various embodiments of the present disclosure with a shortened turn-on duration.

The graphs of FIGS. 4 and 5 together illustrate the contemplated advantages of the amplifier circuit 10 considered above. Specifically, FIG. 4 includes a first plot 64 of the enable logic signal 40 that corresponds to the activation of the current mirror circuit 26 and the current mirror transistor 28 in particular. In a first time period 66, the enable logic signal 40 is in a "low"/"off" state, and begins to transition to the "high"/"on" state at a time instant 68. As the voltage quickly rises, a turn-on event 70 occurs, and continues to rise until a time instant 72. Thereafter, the enable logic signal 40 remains a constant "high"/"on" state.

A second plot 74 shows the transient response of the primary amplifier transistor 20 without use of the first helper circuit 32. The corresponding transitions therein are slightly delayed from that of the enable logic signal 40 shown in the first plot 64. The voltage at the gate 20g drops following shortly after the turn-on event 70, and gradually rises until a steady state point 76. The time between the turn-on event 70 and the steady state point 76 is referenced as a rising transient time 78. In a simulated response, the rising transient time 78 without utilizing the helper transistors was approximately 746 nanoseconds.

FIG. 5 includes a third plot 80 showing the same enable logic signal 40 also corresponding to the activation of the current mirror circuit 26. In a first time period 82, the enable logic signal 40 is in a "low"/"off" state, and likewise begins to transition to the "high"/"on" state at a time instant 84. The voltage quickly rises, and a turn-on event 86 occurs, and continues to rise until a time instant 88, at which point a steady state is reached and remains a constant "high"/"on" for the remainder of the time depicted.

A fourth plot 90 shows the transient response of the primary amplifier 12 with the use of the first helper circuit 32. Again, the corresponding transitions therein are slightly delayed from that of the enable logic signal 40 shown in the third plot 80. The voltage at the gate 20g drops following shortly after the turn-on event 86, and quickly rises until a steady state point 92. The time between the turn-on event 86 and the steady state point 92 is referenced as a rising transient time 94. In a simulated response of the amplifier circuit 10, the rising transient time 94 when utilizing the helper transistors was approximately 249 nanoseconds, a marked improvement.

Figure 6:
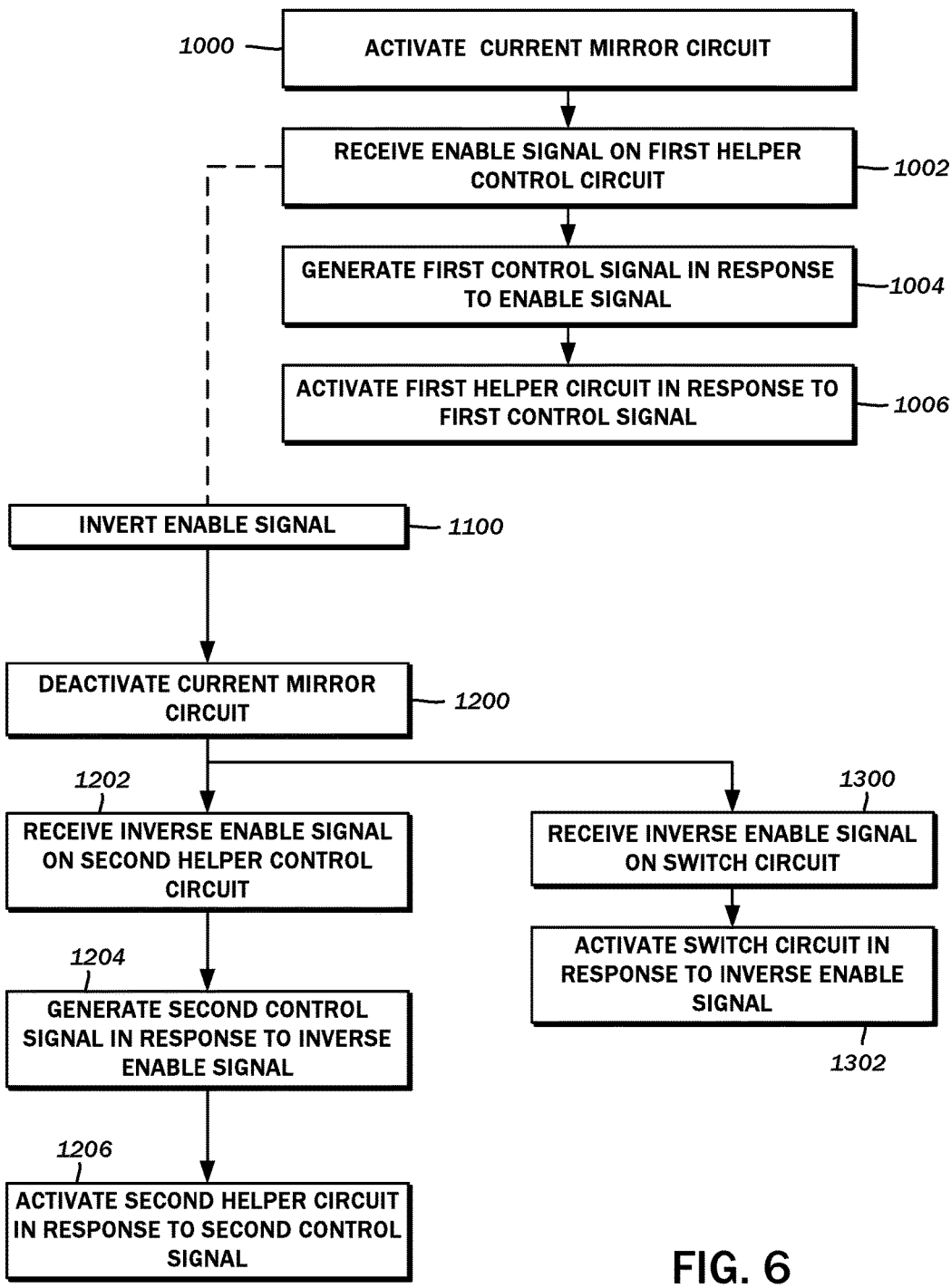
FIG. 6 is a flowchart illustrating an embodiment of a method for reducing a response time of an amplifier circuit.

Referring now to the flowchart of FIG. 6, a method for reducing a response time of the amplifier circuit 10 is also contemplated. The method begins with a step 1000 of activating the current mirror circuit 26. This is followed by a step 1002 of receiving the enable logic signal 40 on the first helper control circuit 36. Then, in accordance with a step 1004, the first control signal 38 is generated. As indicated above, the first control signal 38 is of a first predetermined duration, and is generated in response to the received enable logic signal 40. This is followed by a step 1006 of activating the first helper circuit 32 for the first predetermined duration, in response to the first control signal 38. The activated first helper circuit 32, and in particular the activated first helper transistor 34, is understood to define a lower resistance path relative to the bias resistor 30, and together with the residual capacitance of the gate 20*g* and the coupling capacitor 24, a resistor-capacitor time constant is defined that is lower relative to a resistor-capacitor time constant corresponding to the bias resistor 30 and such residual capacitance.

The foregoing steps 1000-1006 are understood to be those which result in the reduction of the rising transient response, that is, when the primary amplifier 12 is transitioned from the off state to the on state. In another aspect of the method, reduction of the falling transient response is also contemplated. Independent of the foregoing steps, there is a step 1100 of inverting the enable logic signal 40.

The method then continues with a step 1200 of deactivating the current mirror circuit 26, and specifically the current mirror transistor 28. This is followed by a step 1202 of receiving the inverse enable logic signal 54 on the second helper control circuit 50. In a step 1204, the second control signal 52 of a first predetermined duration is generated in response to the received inverse enable logic signal 54. The method continues with a step 1206 of activating the second helper circuit 46 for the second predetermined duration, in response to the second control signal 52. The activated second helper circuit 46, and in particular the second helper transistor 48 is understood to define a lower resistance path relative to the bias resistor 30, and together with the residual capacitance of the gate 20*g* and the coupling capacitor 24, a resistor-capacitor time constant is defined that is lower relative to a resistor-capacitor time constant corresponding to the bias resistor 30 and such residual capacitance.

Figure 7:
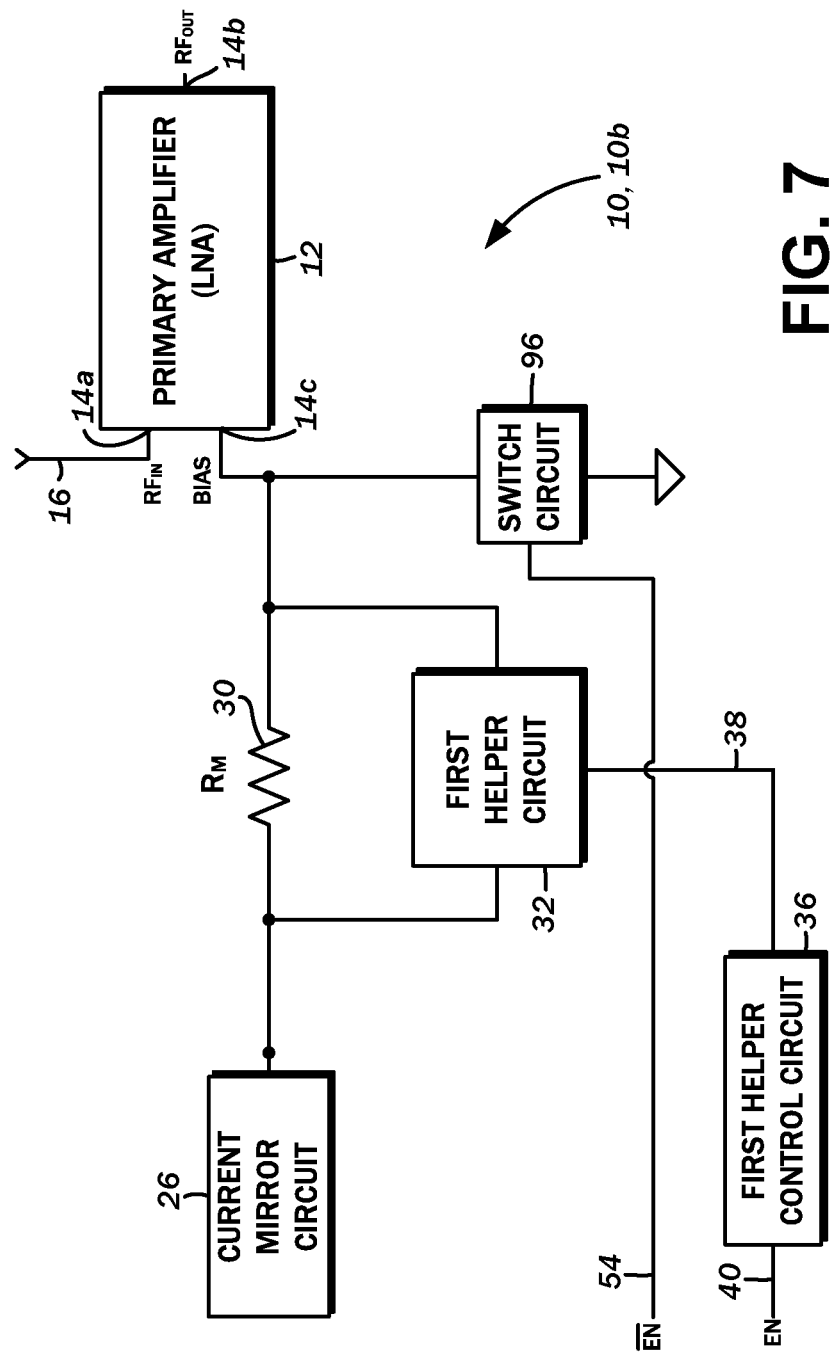
FIG. 7 is a block diagram of the amplifier circuit according to a second embodiment of the present disclosure.
Figure 8:
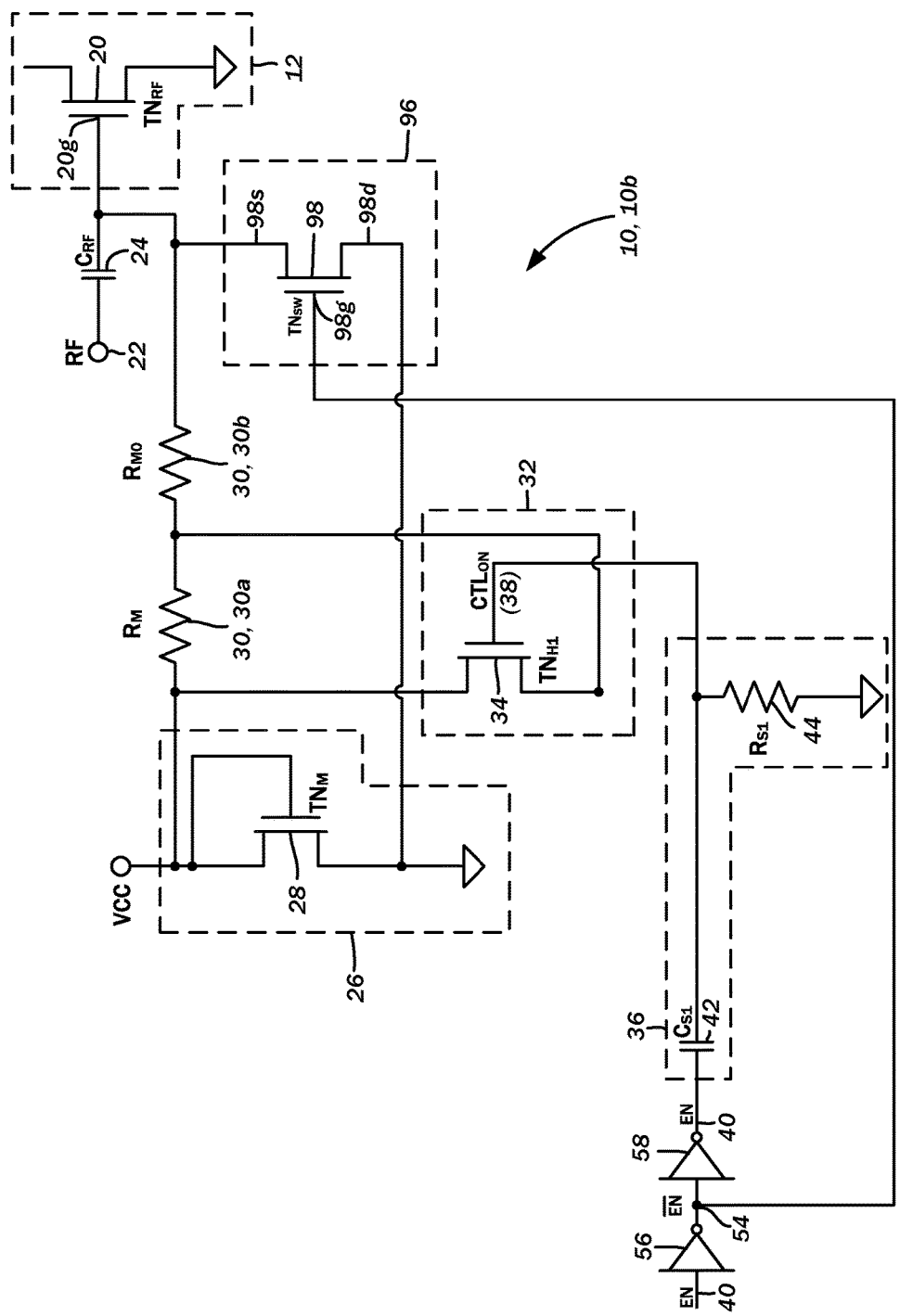
FIG. 8 is a schematic diagram of the second embodiment of an amplifier circuit in accordance with the present disclosure and corresponding to the circuit shown in FIG. 7.

An alternative to utilizing the second helper circuit 46 is contemplated in accordance with a second embodiment of the amplifier circuit 10*b*, illustrated in FIGS. 7 and 8. Like the first embodiment 10*a*, the second embodiment 10*b* includes the primary amplifier 12 that includes the input port 14*a* to which an input radio frequency signal may be provided, the output port 14*b*, and the bias port 14*c* that is connected to the current mirror circuit 26 over the bias resistor 30. In further detail, the gate 20*g* is likewise connected to the radio frequency signal input 22 with the coupling capacitor 24. The current mirror transistor 28 is connected to the primary amplifier transistor 20 via the bias resistor 30, and sets the bias point of the primary amplifier transistor 20. By selectively activating and deactivating the current mirror transistor 28, the primary amplifier transistor 20 is correspondingly activated and deactivated.

The second embodiment of the amplifier circuit 10*b* similarly includes the first helper circuit 32 that is generally defined by the first helper transistor 34 that is connected in parallel across the bias resistor 30. As shown in FIG. 8, the bias resistor 30 may be split, with the main component 30*a* and the secondary component 30*b*. The first helper circuit 32, and hence the first helper transistor 34, is connected across the main component 30*a* only. The first helper circuit 32 is activated and deactivated in response to the first control signal 38 that is generated by the first helper control circuit 36, which is comprised of the first series capacitor 42 and the first shunt resistor 44. The first control signal 38 may be based upon a transient component of the enable logic signal 40 transitioning from the off state to the on state.

In the second embodiment 10*b*, the first inverter 56 and the second inverter 58 are utilized. The first inverter 56 is understood to receive the enable logic signal 40 from an external source, and generates the inverse enable logic signal 54. That inverse enable logic signal 54 is inverted again by the second inverter 58 to generate the enable logic signal 40. As shown in the block diagram of FIG. 7, instead of the first inverter 56 being connected to the second helper control circuit 50 as in the first embodiment of the amplifier circuit 10*b*, it is connected to a switch circuit 96. In further detail, the switch circuit 96 is generally defined by a switch transistor ($TN_{SW}$) 98. The switch transistor 98 has a gate 98*g* connected to the output of the first inverter 56, and therefore driven by the inverse enable logic signal 54. The switch transistor 98 also includes a drain 82*d* connected to ground, and a source 82*s* connected to the gate 20*g* of the primary amplifier transistor 20. In this regard, while the inverse enable logic signal remains "high" or "on", that is, the enable logic signal remains "low" or "off" and thus corresponding to a deactivated current mirror circuit 26 and deactivated primary amplifier 12, the switch circuit 96, and specifically the switch transistor 98 is activated and the gate 20*g* is shorted to ground. The falling transient response of the primary amplifier 12 is thus understood to be reduced.

As shown in the block diagram of FIG. 7, in the second embodiment of the amplifier circuit 10*b*, the current mirror circuit 26 biases and is connected to the primary amplifier 12 over the bias resistor 30. Also connected in parallel to the bias resistor 30 is the first helper circuit 32 that is selectively activated for a predetermined time period by the first helper control circuit 36, which in turn generates the second control signal 52 in response to the enable logic signal 40. The primary amplifier 12, and specifically the bias port 14*c* thereof, is connected to the switch circuit 96 that is selectively activated by the inverse enable logic signal 54. When so activated, the bias port 14*c* is shorted to ground.

Referring back to the flowchart of FIG. 4, there is accordingly an alternative step 1300 of receiving the inverse enable logic signal 54 on the switch circuit 96, specifically at the gate 98*g* of the switch transistor 98. In response, in a step 1302, the switch transistor 98 is activated to short the primary amplifier 12, and the gate 20*g* of the primary amplifier transistor 20 to ground.

Although the features of the helper transistors and helper control circuits have been described in the context of a simple current mirror circuit used to bias a single stage primary amplifier, those having ordinary skill in the art will recognize that these features may be adapted to other, more complex circuits, such as a Wilson current mirrors.

A variety of transistors have been referenced herein, including the primary amplifier transistor 20 the current mirror transistor 28, the first helper transistor 34, the second helper transistor 48, and the switch transistor 98. It is expressly contemplated that such transistors are field effect transistors (FETs) as represented in the schematic diagrams of FIGS. 1 and 2, though any other type of transistor structure may be readily substituted without departing from the present disclosure. Although the present disclosure makes reference to certain features that are specific to field effect transistors such as the gate, the source, and the drain, to the extent different types of transistors are substituted, those features are understood to have corollary features for such alternative transistor types, Furthermore, the transistors and the related circuitry may be fabricated using silicon-based technologies such as bulk CMOS (complementary metal oxide semiconductor), SOI (silicon-on-insulator), and BiCMOS (integration of bipolar junction and complementary metal oxide semiconductor fabrication technologies).

FIG. 8 is a block diagram illustrating a simplified wireless communications device 100 in which an embodiment of amplifier circuit 10 in accordance with the present disclosure may be implemented. In various embodiments, the wireless communications device 100 can be a cellular telephone. However, the amplifier circuit may be utilized in any device that incorporates an amplifier, and fast transient responses are desired. The wireless communications device 100 illustrated in FIG. 8 is intended to be a simplified example of a cellular telephone and to illustrate one of many possible applications in which the amplifier circuit 10 can be implemented. One having ordinary skill in the art will understand the operation of a cellular telephone, and, as such, implementation details are omitted.

The wireless communications device 100 includes a baseband subsystem 102, a transceiver 104, and a front end module 106. Although omitted from FIG. 8, the transceiver 104 includes modulation and upconversion circuitry for preparing a baseband information signal for amplification and transmission, and includes filtering and downconversion circuitry for receiving and downconverting a radio frequency signal to a baseband information signal to recover data. The details of the operation of the transceiver 104 are known to those skilled in the art.

The baseband subsystem 102 generally includes a processor 108, which can be a general purpose or special purpose microprocessor, memory 110, application software 112, analog circuit elements 114, and digital circuit elements 116, connected over a system bus 118. The system bus 118 can include the physical and logical connections to couple the above-described elements together and enable their interoperability.

An input/output (I/O) element 120 is connected to the baseband subsystem 102 over a connection 122, a memory element 124 is coupled to the baseband subsystem 102 over a connection 126 and a power source 128 is connected to the baseband subsystem 102 over connection 130. The I/O element 120 can include, for example, a microphone, a keypad, a speaker, a pointing device, user interface control elements, and any other device or system that allows a user to provide input commands and receive outputs from the wireless communications device 100.

The memory 110 can be any type of volatile or non-volatile memory, and in an embodiment, can include flash memory. The memory element 124 can be permanently installed in the wireless communications device 100, or can be a removable memory element, such as a removable memory card.

The power source 128 can be, for example, a battery, or other rechargeable power source, or can be an adaptor that converts AC power to the correct voltage used by the wireless communications device 100. In an embodiment, the power source can be a battery that provides a nominal voltage output of approximately 3.6 volts (V). However, the output voltage range of the power source can range from approximately 3.0 to 6.0 V.

The processor 108 can be any processor that executes application software 112 to control the operation and functionality of the wireless communications device 100. The memory 110 can be volatile or non-volatile memory, and in an embodiment, can be non-volatile memory that stores the application software 112.

The analog circuit elements 114 and the digital circuit elements 116 include the signal processing, signal conversion, and logic that convert an input signal provided by the I/O element 120 to an information signal that is to be transmitted. Similarly, the analog circuit elements 114 and the digital circuit elements 116 include the signal processing, signal conversion, and logic that convert a received signal provided by the transceiver 104 to an information signal that contains recovered information. The digital circuit elements 116 can include, for example, a Digital Signal Processor (DSP), a Field Programmable Gate Array (FPGA), or any other processing device. Because the baseband subsystem 102 includes both analog and digital elements, it is sometimes referred to as a mixed signal circuit.

Figure 9:
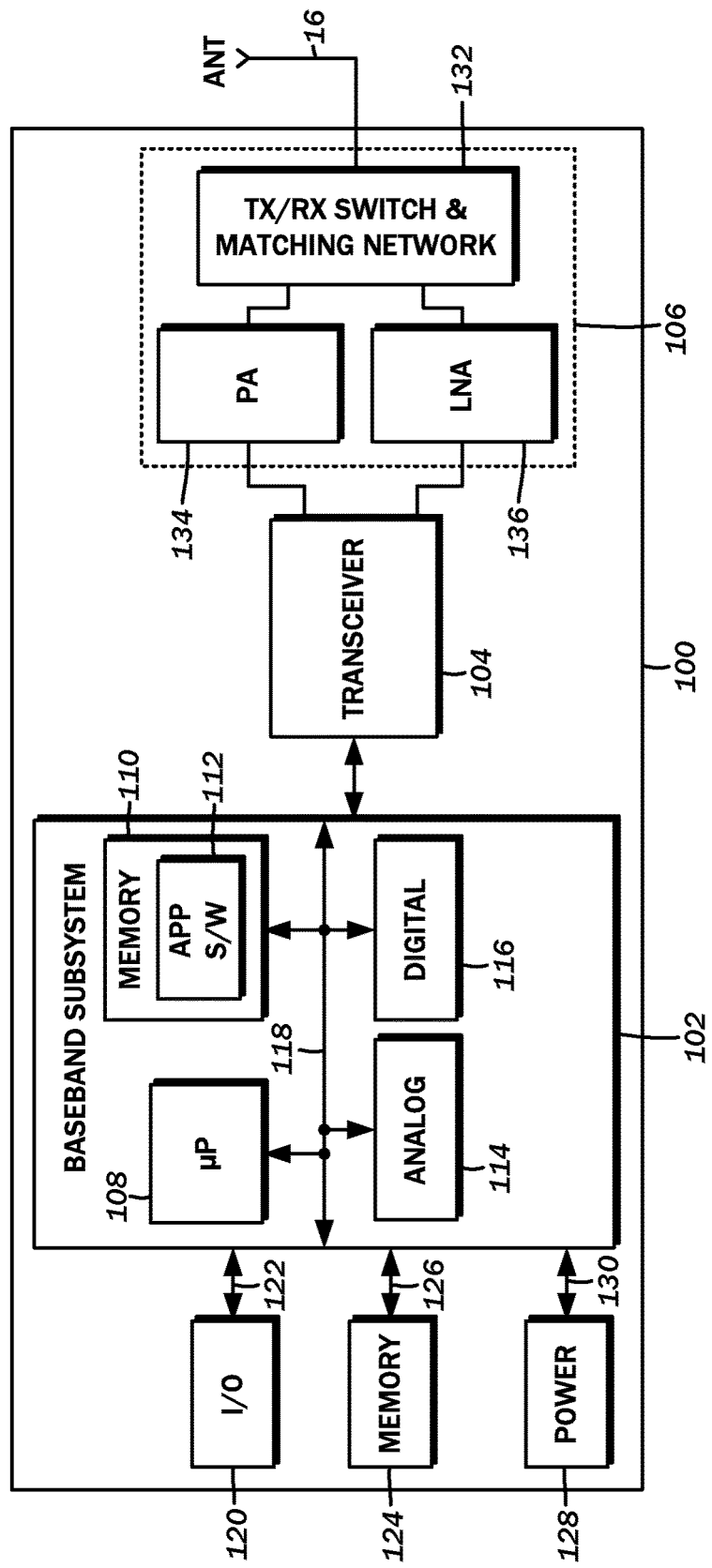
FIG. 9 is a block diagram of an exemplary wireless communications device that may utilize the amplifier circuit of the present disclosure shown in FIGS. 3 and 8.

The front end module 106 is generally comprised of components belonging to a transmit signal chain, components belonging to a receive signal chain, and a switch 132. For purposes of simplification, the transmit signal chain is generally represented by a power amplifier 134, while the receive signal chain is generally represented by a low noise amplifier 136. The switch 132 interconnects the power amplifier 134 and the low noise amplifier 136 to the antenna 16. The front end module 106 depicted in FIG. 9 is understood to be for a single wireless operating mode, and those having ordinary skill in the art will appreciate that a conventional wireless communications device 100 has multiple wireless operating modes conforming to different standards. Accordingly, there may be multiple front end modules 106 particularly configured for each operating mode, or one front end module 106 with multiple constituent components for each operating mode. Along these lines, these different operating modes may utilize more than one antenna at a time (diversity mode operation), so the single antenna 16 is presented by way of example only and not of limitation.

As indicated above, the amplifier circuit 10 of the present disclosure may be implemented in the low noise amplifier 136, in which the current mirror circuit 26 biases the amplifier thereof, and faster turn-on transient responses are possible due to the first helper circuit 32 reducing the RC time constant. It will be appreciated that the amplifier circuit 10 may be utilized in the power amplifier 134 as well, or any other radio frequency circuit component.

Figure 10:
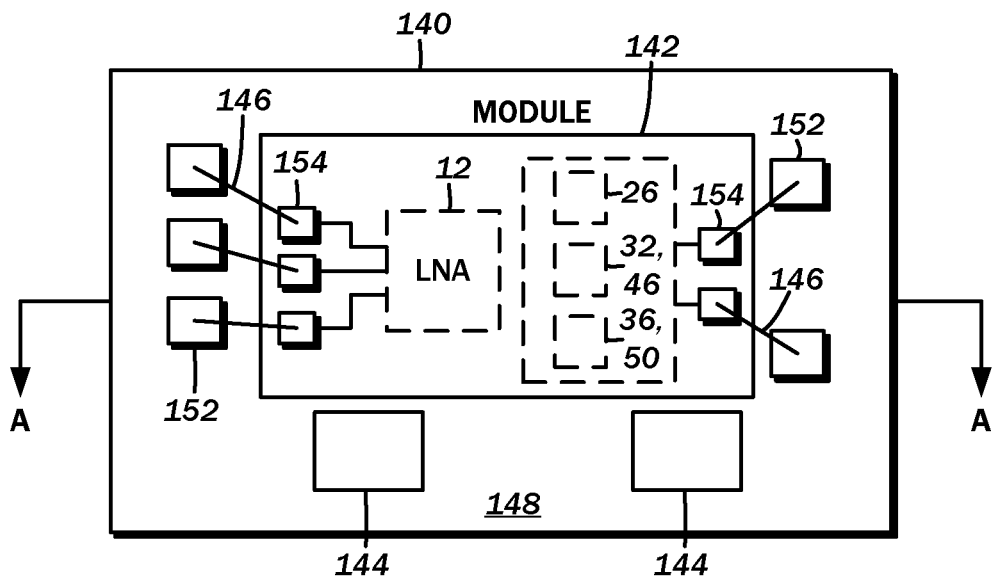
FIG. 10 is a schematic diagram of a packaged amplifier module.
Figure 11:
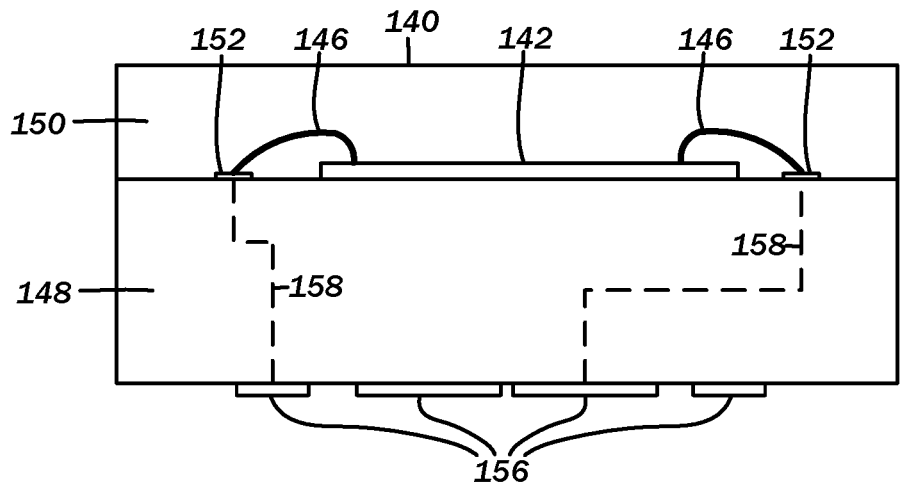
FIG. 11 is a schematic diagram of a cross-section of the packaged amplifier module shown in FIG. 10.

FIG. 10 is a schematic diagram of an embodiment of a packaged radio frequency communications module 140, while FIG. 11 is a schematic diagram of a cross-section of the packaged radio frequency communications module 140 taken along axis A-A of FIG. 10. The packaged radio frequency communications module 140 includes an integrated circuit or die 142, surface mount components 144, wire bonds 146, a package substrate 148, and an encapsulation structure 150. The package substrate 148 includes pads 152 formed from conductors disposed therein. Additionally, the die 142 includes pads 154, and the wire bonds 146 are used to electrically connect the pads 154 of the die 142 to the pads 152 of the package substrate 148.

The die 142 includes the amplifier circuit 10 formed therein. Specifically, the die 142 includes the primary amplifier 12, the current mirror circuit 26, either one or both of the helper circuits 32, 46, and either one or both of the helper control circuits 36, 50. In the embodiments incorporating the switch circuit 96, the die 142 may include the switch circuit 96 as well. The foregoing components on the die 142 are understood to be as described above.

The die 142 is mounted to the package substrate 148 as shown, though it may be configured to receive a plurality of additional components such as the surface mount components 144. These components include additional integrated circuits as well as passive components such as capacitors, inductors, and resistors.

As shown in FIG. 11, the packaged radio frequency communications module 140 is shown to include a plurality of contact pads 156 disposed on the side of the packaged radio frequency communications module 140 opposite the side used to mount the die 142. Configuring the packaged radio frequency communications module 140 in this manner can aid in connecting the same to a circuit board of the wireless communications device 100. The example contact pads 156 can be configured to provide radio frequency signals, bias signals, power low voltage(s) and or power high voltage(s) to the die 142 and/or the surface mount components 144. The electrical connections between the contact pads 156 and the die 142 can be facilitated by connections 158 through the package substrate 148. The connections 158 can represent electrical oaths formed through the package substrate 148, such as connections associated with vias and conductors of a multilayer laminated package substrate.

In some embodiments, the packaged radio frequency communications module 140 can also include or more packaging structures to, for example, provide protection and/or to facilitate handling of the packaged radio frequency communications module 140. Such a packaging structure can include overmold or encapsulation structure 150 formed over the package substrate 148 and the components and die(s) disposed thereon.

It will be understood that although the packaged radio frequency communications module 140 is described in the context of electrical connections based on wire bonds, one or more features of the present disclosure can also be implemented in other packaging configurations, including, for example, flip-chip configurations.

The particulars shown herein are by way of example and for purposes of illustrative discussion of the embodiments of the amplifier circuits and current mirror circuits only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency amplifier circuit comprising:
   a primary amplifier connected to an input signal source;
   a current mirror connected to the primary amplifier to set a bias point thereof;
   a bias resistor connected to the primary amplifier and the current mirror;
   a first helper circuit connected in parallel across the bias resistor, the first helper circuit being selectively activated for a first predetermined duration by a first control signal based upon a transient component of an enable logic signal transitioning from an off state to an on state over a predetermined duration matched to the current mirror responding to reach a steady state from a deactivated state, the activated first helper circuit defining a lower resistance path relative to the bias resistor, the lower resistance path and a residual capacitance at the primary amplifier defining a lower resistor-capacitor time constant to shorten a transient response of the primary amplifier;
   a first helper control circuit connected to the first helper circuit, the first control signal being output by the first helper control circuit in response to the enable logic signal;
   a second helper circuit connected in parallel across the bias resistor, the second helper circuit being selectively activated for a second predetermined duration by a second control signal based upon a transient component of an inverted enable logic signal transitioning from an off state to an on state over a predetermined duration matched to the current mirror responding to reach the deactivated state from the activated state, the activated second helper circuit defining a lower resistance path relative to the bias resistor; and
   a second helper control circuit connected to the second helper circuit, the second control signal being output by the second helper control circuit in response to the inverted enable logic signal.

2. The radio frequency amplifier circuit of claim 1 further comprising a first inverter with an input connected to a source of the enable logic signal, and an output connected to the second helper control circuit.

3. The radio frequency amplifier circuit of claim 2 further comprising a second inverter with an input connected to an output of the first inverter, and an output connected to the first helper control circuit.

4. The radio frequency amplifier circuit of claim 2 wherein the first helper control circuit includes a first series capacitor and a first shunt resistor connected thereto.

5. The radio frequency amplifier circuit of claim 4 wherein the second helper control circuit includes a second series capacitor and a second shunt resistor connected thereto.

6. The radio frequency amplifier circuit of claim 5 wherein capacitance values of the first series capacitor and the second series capacitor are different.

7. The radio frequency amplifier circuit of claim 5 wherein resistance values of the first shunt resistor and the second shunt resistor are different.

8. The radio frequency amplifier circuit of claim 1 wherein the first helper circuit includes a field effect transistor having a gate, a source, and a drain.

9. The radio frequency amplifier circuit of claim 8 wherein the transistor of the first helper circuit is a metal oxide semiconductor field effect transistor.

10. The radio frequency amplifier circuit of claim 1 further comprising a switch circuit connected to the primary amplifier, the primary amplifier being shorted to ground in response to an activation of the switch circuit.

11. The radio frequency amplifier circuit of claim 10 wherein the switch circuit is activated in response to the inverted enable logic signal.

12. The radio frequency amplifier circuit of claim 1 further comprising a secondary bias resistor connected in series with the bias resistor.

13. A current mirror circuit connectible to an amplifier circuit to set a bias point thereof, the current mirror circuit comprising:
   a current mirror transistor;
   a bias resistor connected to the current mirror transistor and connectible to the amplifier circuit;
   a first helper circuit connected in parallel with the bias resistor, the first helper circuit being selectively activated for a first predetermined duration by a first control signal, the activated first helper circuit defining a lower resistance path relative to the bias resistor to shorten a rising transient response of the amplifier circuit as the current mirror transistor is activated; and
   a second helper circuit connected in parallel with the bias resistor, the second helper circuit being selectively activated for a second predetermined duration by a second control signal that is inverse of the first control signal, the activated second helper circuit defining a lower resistance path relative to the bias resistor to shorten a falling transient response of the amplifier circuit as the current mirror transistor is deactivated.

14. The current mirror circuit of claim 13 further comprising a first helper control circuit that generates the first control signal and is connected to the first helper circuit.

15. The current mirror circuit of claim 14 wherein the first helper control circuit includes a first series capacitor and a first shunt resistor connected thereto.

16. The current mirror circuit of claim 14 further comprising a second helper control circuit that generates the second control signal and is connected to the second helper circuit.

17. The current mirror circuit of claim 16 wherein the second helper control circuit includes a second series capacitor and a second shunt resistor connected thereto.

18. The current mirror circuit of claim 13 further comprising a secondary bias resistor connected in series with the bias resistor.

19. The current mirror circuit of claim 13 wherein the first helper circuit and the second helper circuit each includes a field effect transistor having a gate, a source, and a drain.

20. The radio frequency amplifier circuit of claim 19 wherein the transistors of the first helper circuit and the second helper circuit are metal oxide semiconductor field effect transistors.

21. A method for reducing a response time of an amplifier circuit being transitioned from a deactivated state to an activated state with a current mirror circuit, the method comprising:
  activating a current mirror circuit;
  receiving an enable logic signal on a first helper control circuit;
  generating a first control signal of a first predetermined duration with the first helper control circuit in response to the received enable logic signal;
  activating a first helper circuit in response to the first control signal from the first helper control circuit, the first helper control circuit being activated for the first predetermined duration matched to the current mirror circuit responding to reach an activated state from a deactivated state, the first helper circuit defining a lower resistance path relative to a bias resistor in an activated state, and together with a residual capacitance associated with the amplifier circuit and coupling thereto, defines a lower resistor-capacitor time constant relative to a resistor-capacitor time constant corresponding to the bias resistor and the residual capacitance
  deactivating the current mirror circuit;
  receiving the inverted enable logic signal on a second helper control circuit;
  generating a second control signal of a second predetermined duration with the second helper control circuit in response to the received inverted enable logic signal; and
  activating a second helper circuit in response to the second control signal from the second helper control circuit, the second helper control circuit being activated for the second predetermined duration matched to the current mirror circuit responding to reach the deactivated state from the activated state, the second helper circuit defining a lower resistance path relative to the bias resistor in an activated state.

22. The method of claim 21 further comprising inverting the enable logic signal.

23. The method of claim 21 further comprising receiving the inverted enable logic signal on a switch circuit connected to the amplifier circuit, the switch circuit shorting the amplifier circuit to ground in response to being activated by the inverted enable logic signal.

24. A radio frequency communications module comprising:
  a packaging substrate on which a plurality of components are mounted; and
  a radio frequency amplifier implemented on the packaging substrate, the radio frequency amplifier circuit including a first helper circuit selectively activated for a first predetermined duration to define a lower resistance path across a bias resistor interconnecting a current mirror circuit and a primary amplifier circuit based upon a first control signal output by a first helper control circuit in response to an enable logic signal, the first predetermined duration being matched to the current mirror circuit responding to reach a steady state from a deactivated state, the radio frequency amplifier circuit further including a second helper circuit connected in parallel with the bias resistor, the second helper circuit being selectively activated for a second predetermined duration by a second control signal that is inverse of the first control signal, the activated second helper circuit defining a lower resistance path relative to the bias resistor to shorten a falling transient response of the radio frequency amplifier circuit as the current mirror transistor is deactivated.

25. The radio frequency communications module of claim 24 wherein the first control signal is based upon a transient component of the enable logic signal transitioning from a first state to a second state.

26. The radio frequency communications module of claim 24 wherein the primary amplifier circuit of the radio frequency amplifier is a low noise amplifier.

27. The radio frequency communications module of claim 24 wherein the primary amplifier circuit of the radio frequency amplifier is a power noise amplifier.

28. A wireless communications device comprising:
  an antenna receptive to an incoming radio frequency signal and transmissive of an outgoing radio frequency signal; and
  a radio frequency amplifier circuit connected to the antenna, the radio frequency amplifier circuit including a first helper circuit selectively activated for a first predetermined duration to define a lower resistance path across a bias resistor interconnecting a current mirror circuit and a primary amplifier circuit based upon a first control signal output by a first helper control circuit in response to an enable logic signal, the first predetermined duration being matched to the current mirror circuit responding to reach a steady state from a deactivated state, the radio frequency amplifier circuit further including a second helper circuit connected in parallel with the bias resistor, the second helper circuit being selectively activated for a second predetermined duration by a second control signal that is inverse of the first control signal, the activated second helper circuit defining a lower resistance path relative to the bias resistor to shorten a falling transient response of the radio frequency amplifier circuit as the current mirror transistor is deactivated.

29. The wireless communications device of claim 28 wherein the primary amplifier circuit of the radio frequency amplifier is a low noise amplifier configured to amplify the incoming radio frequency signal.

30. The wireless communications device of claim 28 wherein the primary amplifier circuit of the radio frequency amplifier is a power noise amplifier configured to amplify the outgoing radio frequency signal.

\* \* \* \* \*